US012765424B2

(12) United States Patent
Lee et al.

(10) Patent No.: US 12,765,424 B2
(45) Date of Patent: Oct. 13, 2026

(54) SEMICONDUCTOR PACKAGE

(71) Applicant: SAMSUNG ELECTRONICS CO., LTD., Suwon-si (KR)

(72) Inventors: Shle-Ge Lee, Suwon-si (KR); Hyunggil Baek, Suwon-si (KR); Gyunghwan Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 577 days.

(21) Appl. No.: 18/352,177

(22) Filed: Jul. 13, 2023

(65) Prior Publication Data

US 2024/0203958 A1 Jun. 20, 2024

(30) Foreign Application Priority Data

Dec. 14, 2022 (KR) ........................ 10-2022-0174685

(51) Int. Cl.

| | |
|---|---|
| ***H10W 10/17*** | (2026.01) |
| ***H10B 80/00*** | (2023.01) |
| ***H10D 1/68*** | (2025.01) |
| ***H10W 74/10*** | (2026.01) |
| ***H10W 90/00*** | (2026.01) |

(52) U.S. Cl.

CPC ............ *H10W 90/00* (2026.01); *H10B 80/00* (2023.02); *H10D 1/68* (2025.01); *H10W 74/117* (2026.01); *H10W 90/701* (2026.01); *H10W 90/724* (2026.01)

(58) Field of Classification Search

CPC . H10W 90/00; H10W 74/117; H10W 90/701; H10W 90/724; H10B 80/00; H10D 1/68; H01L 23/3128; H01L 23/5385; H01L 23/562; H01L 24/16; H01L 25/0652; H01L 25/105; H01L 25/16; H01L 25/18; H01L 23/49816; H01L 2225/1058

USPC .......................................................... 257/668

See application file for complete search history.

(56) References Cited

U.S. PATENT DOCUMENTS

| | | | |
|---|---|---|---|
| 8,035,216 B2 | 10/2011 | Skeete | |
| 8,320,102 B2 | 11/2012 | Kurioka et al. | |
| 10,950,537 B2 | 3/2021 | Hossain et al. | |
| 11,139,115 B2 | 10/2021 | Cain | |
| 11,289,412 B2 | 3/2022 | Williamson et al. | |
| 2007/0285907 A1 | 12/2007 | Nishikawa et al. | |
| 2021/0289629 A1* | 9/2021 | Lee | H01L 23/50 |

FOREIGN PATENT DOCUMENTS

| | | |
|---|---|---|
| CN | 110641118 A | 1/2020 |
| JP | 2007035870 A | 2/2007 |
| JP | 2008-270369 A | 11/2008 |
| KR | 10-2012-0087651 A | 8/2012 |

(Continued)

*Primary Examiner* — Theresa T Doan

(74) *Attorney, Agent, or Firm* — Wolf, Greenfield & Sacks, P.C.

(57) ABSTRACT

A semiconductor package includes a lower substrate that has a contact region and a non-contact region, a first upper substrate on the lower substrate, a lower device on the first upper substrate, a plurality of first solder balls between the first upper substrate and the lower substrate contact region, a plurality of capacitors between the first upper substrate and the lower substrate non-contact region, and a plurality of support blocks between the plurality of capacitors and the lower substrate non-contact region.

18 Claims, 5 Drawing Sheets

(56) References Cited

FOREIGN PATENT DOCUMENTS

| | | | |
|---|---|---|---|
| KR | 10-2017-0138644 | A | 12/2017 |
| KR | 10-2021-0073904 | A | 6/2021 |
| KR | 10-2021-0114733 | A | 9/2021 |

* cited by examiner

SEMICONDUCTOR PACKAGE

CROSS-REFERENCE TO RELATED APPLICATION

This U.S. nonprovisional application claims priority under 35 U.S.C. § 119 to Korean Patent Application No. 10-2022-0174685 filed on Dec. 14, 2022 in the Korean Intellectual Property Office, the disclosure of which is hereby incorporated by reference in its entirety.

BACKGROUND

The present inventive concepts relate to packages, and more particularly, to semiconductor packages.

The sizes of semiconductor chips are becoming smaller as a result of the high integration of semiconductor chips. In addition, as the size of semiconductor chips decreases, it may become difficult to handle and test these smaller semiconductor chips. A package on which application processors are mounted may include a capacitor to improve electrical properties.

SUMMARY

Some embodiments of the present inventive concepts provide semiconductor packages whose solder balls are suppressed from crack damage due to thermal expansion of an underfill layer.

According to some embodiments of the present inventive concepts, a semiconductor package may comprise: a lower substrate that has a contact region and a non-contact region, wherein the contact region extends around the non-contact region; a first upper substrate on the lower substrate; a lower device on the first upper substrate; a plurality of first solder balls between the first upper substrate and the lower substrate contact region; a plurality of capacitors between the first upper substrate and the lower substrate non-contact region; and a plurality of support blocks between the plurality of capacitors and the lower substrate non-contact region.

According to some embodiments of the present inventive concepts, a semiconductor package may comprise: a lower substrate that has a contact region and a non-contact region, wherein the contact region extends around the non-contact region; a first upper substrate on the lower substrate; a lower device on the first upper substrate; a plurality of first solder balls between the first upper substrate and the lower substrate contact region; a plurality of passive devices between the first upper substrate and the lower substrate non-contact region; a first underfill layer between the plurality of first solder balls; and a plurality of support blocks between the lower substrate non-contact region and the plurality of passive devices, wherein the plurality of support blocks have a thermal expansion coefficient less than a thermal expansion coefficient of the first underfill layer.

According to some embodiments of the present inventive concepts, a semiconductor package may comprise: a lower substrate that has a contact region and a non-contact region, wherein the contact region extends around the non-contact region; a first upper substrate on the lower substrate; a lower device on the first upper substrate; a plurality of first solder balls between the first upper substrate and the lower substrate contact region; a plurality of passive devices between the first upper substrate and the lower substrate non-contact region; a first underfill layer between the plurality of first solder balls; a plurality of support blocks between the lower substrate of the non-contact region and the plurality of passive devices, wherein the plurality of support blocks have a thermal expansion coefficient less than a thermal expansion coefficient of the first underfill layer; a second upper substrate on the lower device and the first upper substrate; a plurality of second solder balls between the first and second upper substrates; and a second underfill layer between the lower device and the plurality of second solder balls, wherein the second underfill layer has a thermal expansion coefficient less than the thermal expansion coefficient of the first underfill layer.

DETAILED DESCRIPTION

Figure 1:
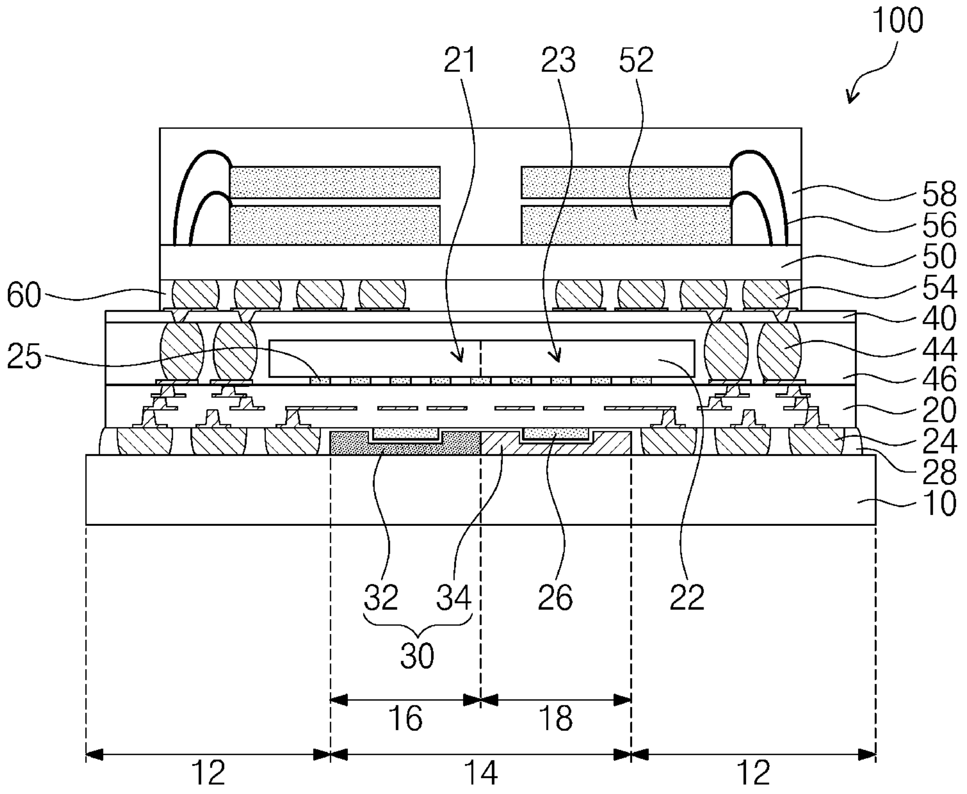
FIG. 1 illustrates a cross-sectional view showing an example of a semiconductor package according to some embodiments of the present inventive concepts.
Figure 2:
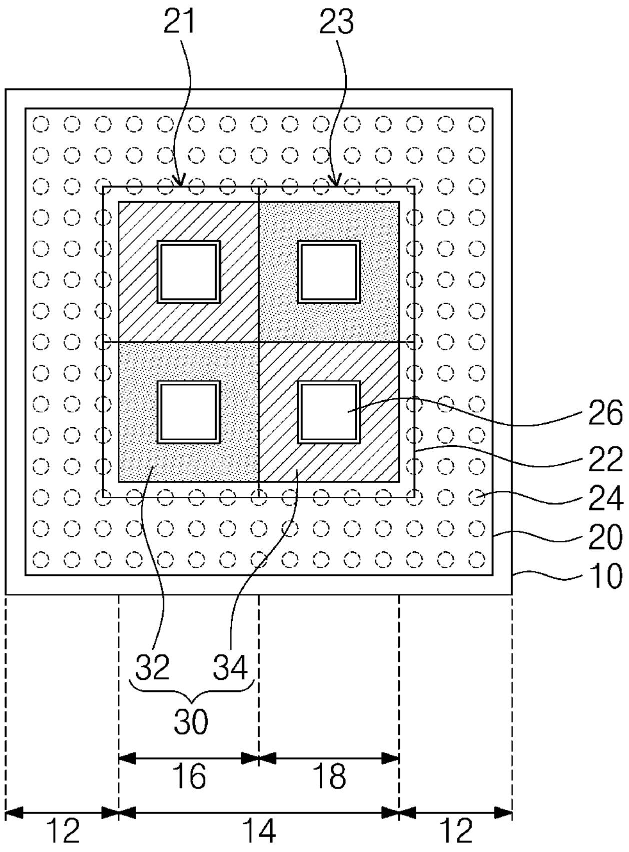
FIG. 2 illustrates a plan view showing an example of support blocks shown in FIG. 1.

FIG. 1 shows an example of a semiconductor package according to some embodiments of the present inventive concepts. FIG. 2 shows an example of support blocks shown in FIG. 1.

Referring to FIGS. 1 and 2, a semiconductor package 100 of the present inventive concepts may include a fan-out wafer level package (FOWLP). According to an embodiment, the semiconductor package 100 of the present inventive concepts may include a lower substrate 10, a first upper substrate 20, a lower device 22, passive devices 26, support blocks 30, a second upper substrate 40, a third upper substrate 50, and upper devices 52.

The lower substrate 10 may be provided below the first upper substrate 20 and the lower device 22. For example, the lower substrate 10 may include a printed circuit board. For another example, the lower substrate 10 may include a redistribution substrate, but the present inventive concepts are not limited thereto. According to an embodiment, the lower substrate 10 may include a contact region 12 and a non-contact region 14.

The contact region 12 may be an edge region of the lower substrate 10. In addition, the contact region 12 may be a connection region where first solder balls 24 are provided. For example, the contact region 12 may be a pad region connected to the first solder balls 24.

The non-contact region 14 may be provided on a center of the lower substrate 10. The non-contact region 14 may be provided in the contact region 12 (i.e., the contact region 12 extends around the non-contact region). The non-contact region 14 may be a protruding region of the lower substrate 10. In addition, the non-contact region 14 may be a depopulated region where the first solder balls 24 are absent. The non-contact region 14 may be a support region of the passive devices 26. According to an embodiment, the non-contact region 14 may include a first non-contact region 16 and a second non-contact region 18.

The first non-contact region 16 may be provided on one side of the center of the lower substrate 10. The first non-contact region 16 may be provided below a low-temperature region 21 of the lower device 22. The first non-contact region 16 may be a low heating region.

The second non-contact region 18 may be provided on another side of the center of the lower substrate 10. The second non-contact region 18 may be provided below a high-temperature region 23 of the lower device 22. The second non-contact region 18 may be a high heating region.

The first upper substrate 20 may be provided on the lower substrate 10. The first upper substrate 20 may include the same material as that of the lower substrate 10. The first upper substrate 20 may include a printed circuit board. Alternatively, the first upper substrate 20 may include a redistribution layer, but the present inventive concepts are not limited thereto.

The lower device 22 may be provided on the first upper substrate 20. The lower device 22 may be connected through bumps 25 to the first upper substrate 20. The lower device 22 may include an application processor. When viewed in plan (FIG. 2), the lower device 22 may be wider than the passive devices 26. According to an embodiment, the lower device 22 may include low-temperature regions 21 and high-temperature regions 23. The low-temperature regions 21 may be low heating regions or low loading regions. For example, the low-temperature regions 21 may include a communication region and a power region. The high-temperature regions 23 may be high heating regions or high loading regions. For example, the high-temperature regions 23 may include a central processing unit (CPU) region or a graphic processing unit (GPU) region.

The first solder balls 24 may be provided between the lower substrate 10 and the first upper substrate 20. The first solder balls 24 may connect the lower substrate 10 to the lower device 22 and the first upper substrate 20. The lower substrate 10 and the first upper substrate 20 may be provided with the first solder balls 24 on regions adjacent their edges beyond the passive devices 26, as illustrated in FIG. 1. The first solder balls 24 may have a thickness greater than a thickness of the passive devices 26. The first solder balls 24 may each have a thickness of about 150 μm to about 500 μm.

Referring still to FIGS. 1 and 2, the passive devices 26 may be provided between the lower substrate 10 and the first upper substrate 20. The passive devices 26 may be provided on the first non-contact region 16 and the second non-contact region 18 of the lower substrate 10. The passive devices 26 may be connected to and/or in contact with a bottom surface of the first upper substrate 20. The passive devices 26 may each have a thickness less than a distance between the lower substrate 10 and the first upper substrate 20. The passive devices 26 may each have a thickness of about 10 μm to about 100 μm. When viewed in plan (FIG. 2), the passive devices 26 may each be narrower or smaller than the lower device 22 and the support block 30. The passive devices 26 may improve electrical properties of the lower device 22. For example, the passive devices 26 may stabilize power of the lower device 22. For another example, the passive devices 26 may eliminate noise (e.g., EMI) of data signals of the lower device 22, but the present inventive concepts are not limited thereto. According to an embodiment, the passive devices 26 may include a capacitor. For example, the passive devices 26 may include a land side capacitor (LSC). For another example, the passive devices 26 may include a resistor, but the present inventive concepts are not limited thereto. The passive devices 26 may include a crystalline silicon material.

A first underfill layer 28 may be provided between the first solder balls 24. The first underfill layer 28 may be provided between the first solder balls 24 and the support blocks 30. The first underfill layer 28 may have a thermal expansion coefficient different from that of the first solder balls 24. The thermal expansion coefficient of the first underfill layer 28 may be greater than that of the passive devices 26. The thermal expansion coefficient of the first underfill layer 28 may the same as that of the lower substrate 10 and that of the first upper substrate 20. For example, the first underfill layer 28 may include epoxy. For another example, the first underfill layer 28 may include a polymer compound, but the present inventive concepts are not limited thereto.

The support blocks 30 may be provided between the passive devices 26 and the lower substrate 10 of the first and second non-contact regions 16 and 18. The support blocks 30 may be provided between the first upper substrate 20 outside (i.e., further beyond) the passive devices 26 and the lower substrate 10 of the first and second non-contact regions 16 and 18. When viewed in plan (FIG. 2), the support blocks 30 may be wider than the passive devices 26 and narrower than the lower device 22. The support blocks 30 may minimize the first underfill layer 28 between the passive devices 26 and the lower substrate 10 to prevent or suppress the first solder balls 24 from crack damage due to a difference in thermal expansion of the first underfill layer 28. Each of the support blocks 30 may have a protruding portion on a lateral surface of the passive device 26. For example, each of the support blocks 30 may have a groove or recess that receives the passive device 26, as illustrated in FIG. 1.

The first underfill layer 28 may be provided between the passive devices 26 and the lower substrate 10 to reduce crack damage to the first solder balls 24 outside (i.e., further out from) the passive devices 26 when the semiconductor package 100 undergoes a high-temperature reliability test. On the passive devices 26 on a central area of the lower substrate 10, the support blocks 30 may minimize and/or reduce the first underfill layer 28 to prevent crack damage of the first solder balls 24.

The semiconductor package 100 of the present inventive concepts may use the support blocks 30 between the passive devices 26 and the lower substrate 10 to minimize (i.e., reduce the thickness of) the first underfill layer 28 between the passive devices 26 and the lower substrate 10, with the result that the first solder balls 24 may be suppressed from crack damage due to thermal expansion of the first underfill layer 28.

According to an embodiment, the support blocks 30 may have a thermal expansion coefficient less than that of the first underfill layer 28. The support blocks 30 may have a thickness less than a thickness of the first solder balls 24. The thickness of each of the support blocks 30 may be greater than that of each of the passive devices 26. For example, the support blocks 30 may each have a thickness of about 100 μm to about 400 μm. The support blocks 30 may be spaced apart at an interval of about 10 μm to about 100 μm from the passive devices 26, and thus may reduce impact damage of the passive devices 26. The support blocks 30 may have their areas greater than those of the passive devices 26.

According to an embodiment, the support blocks 30 may include a first support block 32 and a second support block 34.

The first support block 32 may be provided on the lower substrate 10 of the first non-contact region 16. The first support block 32 may be provided below bottom and lateral surfaces of one of the passive devices 26. The first support block 32 may have a thermal expansion coefficient less than that of the first underfill layer 28. For example, the first support block 32 may include resin. The first support block 32 may have a concave shape or a flat shape.

The second support block 34 may be provided on the lower substrate 10 of the second non-contact region 18. The second support block 34 may be provided below bottom and lateral surfaces of another of the passive devices 26. The second support block 34 may have a thermal expansion coefficient less than that of the first support block 32. For example, the second support blocks 34 may include silicon (Si) or silicon carbide (SiC). The second support block 34 may have the same shape as that of the first support block 32. The second support block 34 may have a concave shape or a flat shape.

The second upper substrate 40 may be provided on the lower device 22 and the first upper substrate 20. The second upper substrate 40 may include an interposer substrate. Alternatively, the second upper substrate 40 may include a redistribution substrate or a printed circuit board, but the present inventive concepts are not limited thereto.

The first upper substrate 20 may be provided with second solder balls 44 on a region adjacent its edge outside (i.e., further beyond) the lower device 22, as illustrated in FIG. 1. The second solder balls 44 may be taller than the bumps 25 and the lower device 22. The second solder balls 44 may connect the second upper substrate 40 to the first upper substrate 20. The second solder balls 44 may include post electrodes.

A second underfill layer 46 may be provided between the first upper substrate 20 and the second upper substrate 40. The second underfill layer 46 may have a thermal expansion coefficient less than that of the first underfill layer 28 and that of the first support block 32. The thermal expansion coefficient of the second underfill layer 46 may be the same as or similar to that of the second support block 34. For example, the second underfill layer 46 may include alumina ($Al_2O_3$), aluminum nitride (AlN), or silicon carbide (SiC).

The third upper substrate 50 may be provided on the second upper substrate 40. The third upper substrate 50 may include an interposer substrate or a redistribution substrate. Alternatively, the third upper substrate 50 may include a printed circuit board, but the present inventive concepts are not limited thereto.

Third solder balls 54 may be provided between the second upper substrate 40 and the third upper substrate 50. The third solder balls 54 may connect the third upper substrate 50 to the second upper substrate 40.

A third underfill layer 60 may be provided around the third solder balls 54 between the second upper substrate 40 and the third upper substrate 50. The third underfill layer 60 may have a thermal expansion coefficient greater than that of the second underfill layer 46. The thermal expansion coefficient of the third underfill layer 60 may be the same as that of the first underfill layer 28. The third underfill layer 60 may include epoxy.

The upper devices 52 may be provided on the third upper substrate 50. The upper devices 52 may be stacked (i.e., the upper devices 52 are on top of each other). The upper devices 52 may be connected through wires 56 to the third upper substrate 50 and the lower device 22. A mold layer 58 may protect the upper devices 52 from the external environment. The mold layer 58 may include an epoxy molding compound (EMC). According to an embodiment, the upper devices 52 may include a memory device. For example, the upper devices 52 may include a volatile memory device, such as dynamic random access memory (DRAM). For another example, the upper devices 52 may include a nonvolatile memory device, such as flash memory, but the present inventive concepts are not limited thereto.

Figure 3:
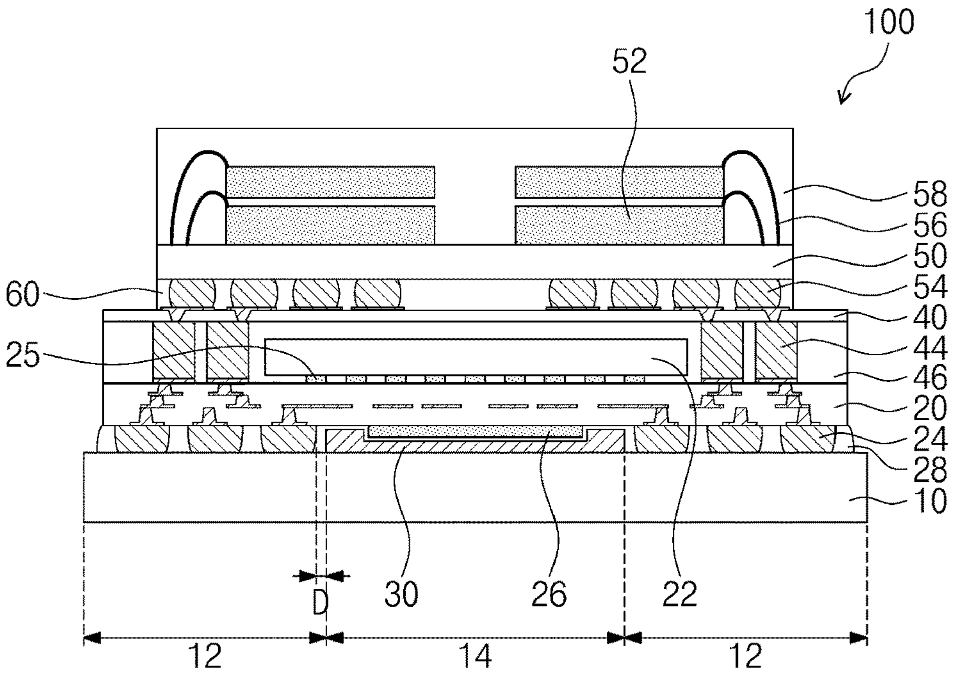
FIG. 3 illustrates a cross-sectional view showing an example of a semiconductor package according to some embodiments of the present inventive concepts.

FIG. 3 shows an example of a semiconductor package according to some embodiments of the present inventive concepts.

Referring to FIG. 3, a semiconductor package 100 of the present inventive concepts may include one passive device 26 and one support block 30. A range of about 80 μm to about 120 μm may be given as a spacing distance D between the support block 30 and the first solder balls 24. For example, a value of about 120 μm may be given as the spacing distance D between the support block 30 and the first solder balls 24.

The second solder balls 44 may include a post electrode having a shape perpendicular to the first upper substrate 20 and the second upper substrate 40.

The lower substrate 10, the first upper substrate 20, the lower device 22, the second upper substrate 40, the third upper substrate 50, and the upper devices 52 may be configured identically to those of FIG. 1.

Figure 4:
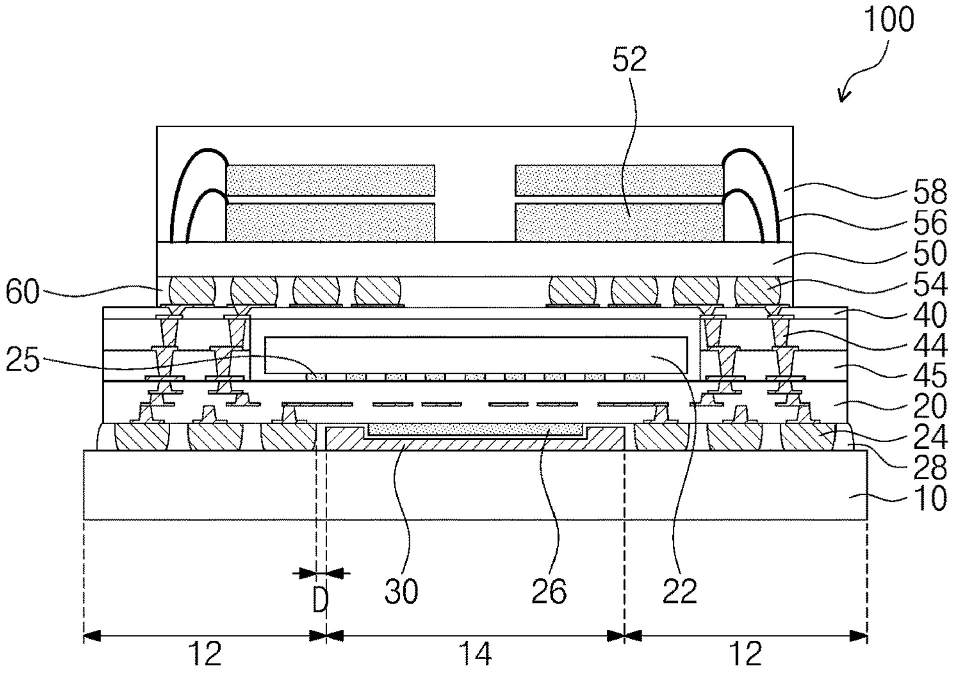
FIG. 4 illustrates a cross-sectional view showing an example of a semiconductor package according to some embodiments of the present inventive concepts.

FIG. 4 shows an example of a semiconductor package according to some embodiments of the present inventive concepts.

Referring to FIG. 4, a semiconductor package 100 of the present inventive concepts may include a fan-out package level package (FOPLP). According to an embodiment, the semiconductor package 100 of the present inventive concepts may further include a connection substrate 45. The connection substrate 45 may replace the second solder balls 44 of FIG. 1 or 3, and may be provided around the lower device 22. The connection substrate 45 may connect the first upper substrate 20 to the second upper substrate 40.

The lower substrate 10, the first upper substrate 20, the lower device 22, the passive devices 26, the support block 30, the second upper substrate 40, the third upper substrate 50, and the upper devices 52 may be configured identically to those of FIG. 3.

Figure 5:
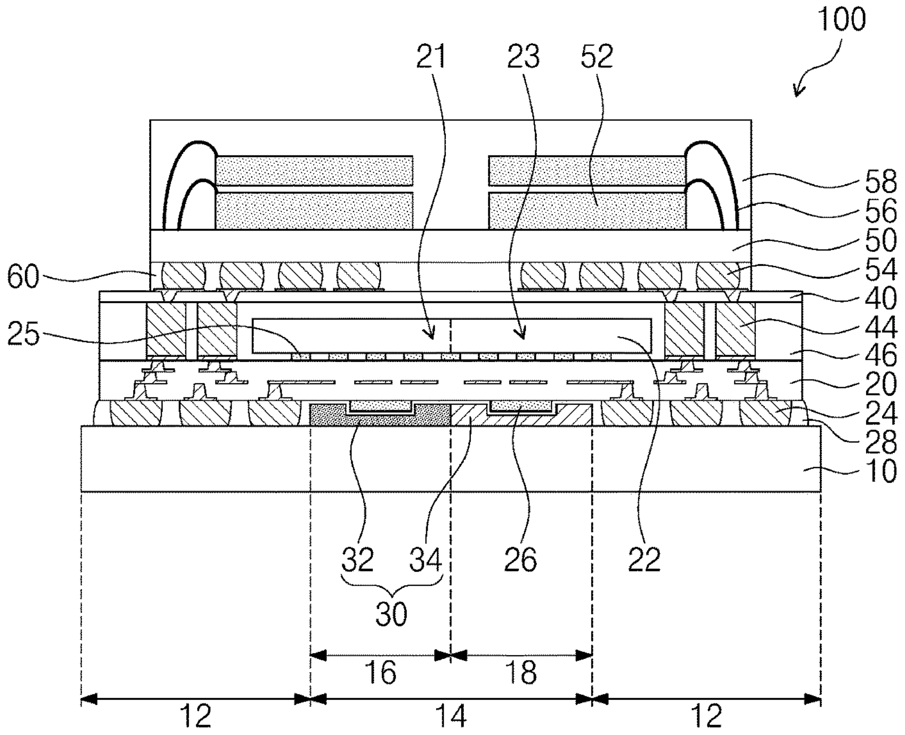
FIG. 5 illustrates a cross-sectional view showing an example of a semiconductor package according to some embodiments of the present inventive concepts.

FIG. 5 shows an example of a semiconductor package according to some embodiments of the present inventive concepts.

Referring to FIG. 5, a semiconductor package 100 of the present inventive concepts may be a fan-out wafer level package (FOWLP), and may include support blocks 30 including a first support block 32 and a second support block 34.

The lower substrate 10, the first upper substrate 20, the lower device 22, the passive devices 26, the support blocks 30, the second upper substrate 40, the third upper substrate 50, and the upper devices 52 may be configured identically to those of FIG. 1, and the second solder balls 44 may be configured identically to that of FIG. 3.

Figure 6:
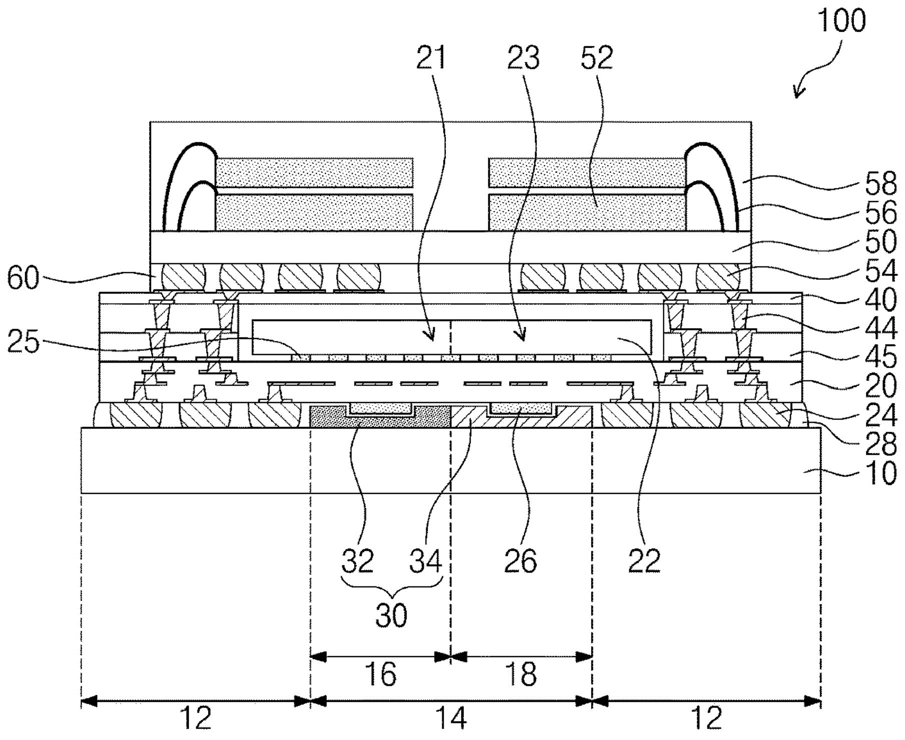
FIG. 6 illustrates a cross-sectional view showing an example of a semiconductor package according to some embodiments of the present inventive concepts.

FIG. 6 shows an example of a semiconductor package according to some embodiments of the present inventive concepts.

Referring to FIG. 6, a semiconductor package 100 of the present inventive concepts may be a fan-out package level package (FOPLP), and may include support blocks 30 including a first support block 32 and a second support block 34.

The lower substrate 10, the first upper substrate 20, the lower device 22, the passive devices 26, the support blocks 30, the second upper substrate 40, the third upper substrate 50, and the upper devices 52 may be configured identically to those of FIG. 1, and the second solder balls 44 may be configured identically to that of FIG. 4.

Figure 7:
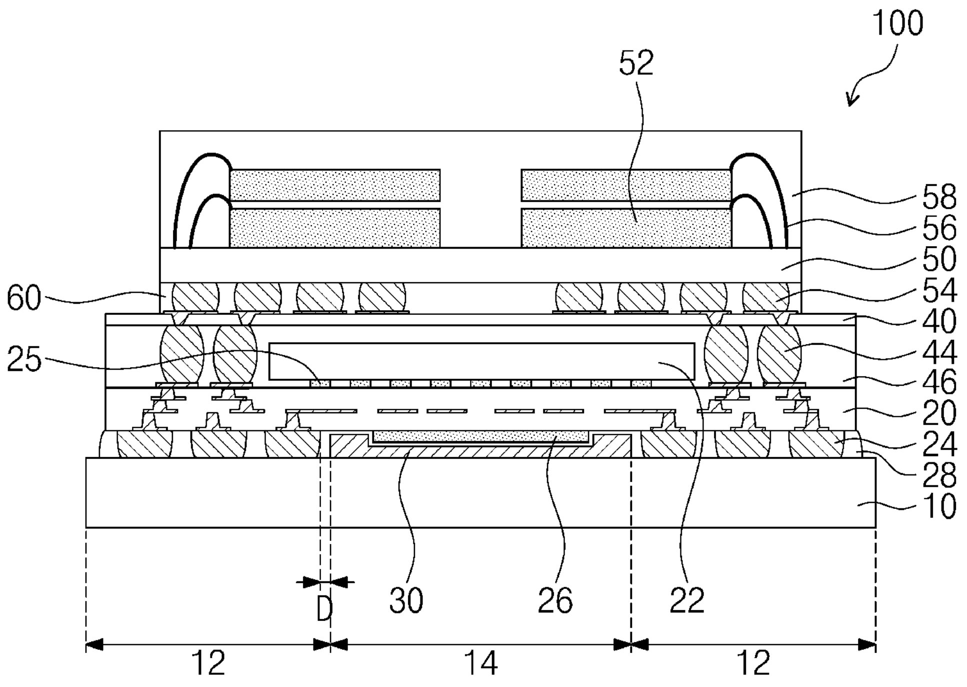
FIG. 7 illustrates a cross-sectional view showing an example of a semiconductor package according to some embodiments of the present inventive concepts.

FIG. 7 shows an example of a semiconductor package according to some embodiments of the present inventive concepts.

Referring to FIG. 7, a semiconductor package 100 of the present inventive concepts may include one passive device 26 and one support block 30.

The lower substrate 10, the first upper substrate 20, the lower device 22, the passive device 26, the support block 30, the second upper substrate 40, the third upper substrate 50, and the upper devices 52 may be configured identically to those of FIG. 1.

As discussed above, a semiconductor package according to some embodiments of the present inventive concepts may be configured such that support blocks between a capacitor and a lower substrate are used to minimize an underfill layer between the capacitor and the lower substrate and to suppress solder balls from crack damage due to thermal expansion of the underfill layer.

The above descriptions are specific examples for practicing the present inventive concepts. The present inventive concepts will include not only the embodiments described above but also embodiments that can be easily or simply changed in design. In addition, the present inventive concepts will also include technique that can be modified and implemented using the embodiments described above.

What is claimed is:

1. A semiconductor package, comprising:
- a lower substrate comprising a contact region and a non-contact region, wherein the contact region extends around the non-contact region, wherein the non-contact region comprises a first non-contact region and a second non-contact region adjacent to the first non-contact region;
- a first upper substrate on the lower substrate;
- a lower device on the first upper substrate, the lower device comprising a low-temperature region on the first non-contact region and a high-temperature region on the second non-contact region;
- a plurality of first solder balls between the first upper substrate and the contact region of the lower substrate;
- a plurality of capacitors between the first upper substrate and the non-contact region of the lower substrate; and
- a plurality of support blocks between the plurality of capacitors and the non-contact region of the lower substrate.

2. The semiconductor package of claim 1, wherein the plurality of support blocks comprise:
- a first support block between the first non-contact region of the lower substrate and one of the plurality of capacitors, wherein the first support block comprises a recess that receives the one of the plurality of capacitors; and
- a second support block between the second non-contact region of the lower substrate and another one of the plurality of capacitors, wherein the second support block comprises a recess that receives the another one of the plurality of capacitors.

3. The semiconductor package of claim 2, wherein the first support block comprises resin.

4. The semiconductor package of claim 2, wherein the second support block comprises silicon or silicon carbide.

5. The semiconductor package of claim 1, wherein
- the lower device comprises an application processor,
- the low-temperature region comprises a communication region or a power region, and
- the high-temperature region comprises a central processing unit (CPU) region and a graphic processing unit (GPU) region.

6. The semiconductor package of claim 1, further comprising a first underfill layer between the plurality of first solder balls and the plurality of support blocks,
- wherein the plurality of support blocks have a thermal expansion coefficient less than a thermal expansion coefficient of the first underfill layer.

7. The semiconductor package of claim 6, further comprising:
- a second upper substrate on the first upper substrate and the lower device;
- a plurality of second solder balls between the first and second upper substrates; and
- a second underfill layer between the lower device and the plurality of second solder balls, wherein the second underfill layer has a thermal expansion coefficient less than the thermal expansion coefficient of the first underfill layer.

8. The semiconductor package of claim 7, further comprising:
- a third upper substrate on the second upper substrate;
- a plurality of third solder balls between the second upper substrate and the third upper substrate;
- a third underfill layer between the plurality of third solder balls, wherein the third underfill layer has a thermal expansion coefficient greater than the thermal expansion coefficient of the second underfill layer; and
- a plurality of upper devices on the third upper substrate,
- wherein the plurality of upper devices comprise a memory device.

9. A semiconductor package, comprising:
- a lower substrate comprising a contact region and a non-contact region, wherein the contact region extends around the non-contact region;
- a first upper substrate on the lower substrate;
- a lower device on the first upper substrate;
- a plurality of first solder balls between the first upper substrate and the contact region of the lower substrate;
- a plurality of passive devices between the first upper substrate and the non-contact region of the lower substrate;
- a first underfill layer between the plurality of first solder balls; and
- a plurality of support blocks between the non-contact region of the lower substrate and the plurality of passive devices, wherein the plurality of support blocks have a thermal expansion coefficient less than a thermal expansion coefficient of the first underfill layer.

10. The semiconductor package of claim 9, wherein the plurality of support blocks comprise:
- a first support block on one side of the non-contact region; and
- a second support block on another side of the non-contact region and in contact with the first support block, wherein the second support block has a thermal expansion coefficient less than a thermal expansion coefficient of the first support block.

11. The semiconductor package of claim 10, wherein the first support block comprises resin.

12. The semiconductor package of claim 10, wherein the second support block comprises silicon or silicon carbide.

13. The semiconductor package of claim 10, wherein the plurality of passive devices comprise an application processor having a low-temperature region on the first support block and a high-temperature region on the second support block.

14. A semiconductor package, comprising:

a lower substrate comprising a contact region and a non-contact region, wherein the contact region extends around the non-contact region;

a first upper substrate on the lower substrate;

a lower device on the first upper substrate;

a plurality of first solder balls between the first upper substrate and the contact region of the lower substrate;

a plurality of passive devices between the first upper substrate and the non-contact region of the lower substrate;

a first underfill layer between the plurality of first solder balls;

a plurality of support blocks between the non-contact region of the lower substrate and the plurality of passive devices, wherein the plurality of support blocks have a thermal expansion coefficient less than a thermal expansion coefficient of the first underfill layer;

a second upper substrate on the lower device and the first upper substrate;

a plurality of second solder balls between the first and second upper substrates; and a second underfill layer between the lower device and the plurality of second solder balls, wherein the second underfill layer has a thermal expansion coefficient less than the thermal expansion coefficient of the first underfill layer.

15. The semiconductor package of claim 14, wherein the thermal expansion coefficient of the plurality of support blocks is the same as the thermal expansion coefficient of the second underfill layer.

16. The semiconductor package of claim 14, further comprising:

a plurality of third solder balls on the second upper substrate;

a third upper substrate on the plurality of third solder balls; and a plurality of upper devices on the third upper substrate.

17. The semiconductor package of claim 16, further comprising a third underfill layer between the plurality of third solder balls, wherein the third underfill layer has a thermal expansion coefficient the same as the thermal expansion coefficient of the first underfill layer.

18. The semiconductor package of claim 16, wherein the lower device comprises an application processor, and the plurality of upper devices comprise a memory device.

* * * * *